United States Patent [19]
Thakur

[11] Patent Number: 5,407,534
[45] Date of Patent: Apr. 18, 1995

[54] METHOD TO PREPARE HEMI-SPHERICAL GRAIN (HSG) SILICON USING A FLUORINE BASED GAS MIXTURE AND HIGH VACUUM ANNEAL

[75] Inventor: Randhir P. S. Thakur, Boise, Id.

[73] Assignee: Micron Semiconductor, Inc., Boise, Id.

[21] Appl. No.: 166,058

[22] Filed: Dec. 10, 1993

[51] Int. Cl.6 ............................................. H01L 21/00
[52] U.S. Cl. ................................. 156/662; 156/646;
156/643; 437/109; 437/247
[58] Field of Search ..................... 156/662, 646, 643;
437/109, 247

[56] References Cited

U.S. PATENT DOCUMENTS

| | | | |
|---|---|---|---|
| 5,134,086 | 7/1992 | Ahn | 437/52 |
| 5,162,248 | 11/1992 | Dennison et al. | 437/52 |
| 5,170,233 | 12/1992 | Liu et al. | 437/52 |
| 5,227,322 | 7/1993 | Ko et al. | 437/52 |
| 5,278,091 | 1/1994 | Fazan et al. | 437/52 |
| 5,340,765 | 8/1994 | Dennison et al. | 437/52 |

FOREIGN PATENT DOCUMENTS 4-280669 10/1992 Japan.
5-315543 11/1993 Japan.

*Primary Examiner*—Nam Nguyen
*Assistant Examiner*—George Goudreau
*Attorney, Agent, or Firm*—David J. Paul

[57] ABSTRACT

The present invention develops a process for forming hemi-spherical grained silicon storage capacitor plates by the steps of: forming a silicon layer over a pair of neighboring parallel conductive lines, the silicon layer making contact to an underlying conductive region; patterning the silicon layer to form individual silicon capacitor plates; exposing the silicon capacitor plates to a fluorine based gas mixture during an high vacuum annealing period, thereby transforming the silicon capacitor plates into the semi-spherical grained silicon capacitor plates; conductively doping the hemispherical grained silicon capacitor plates; forming a capacitor dielectric layer adjacent and coextensive the semispherical grained silicon capacitor plates; and forming a second conductive silicon layer superjacent and coextensive the capacitor dielectric layer.

42 Claims, 5 Drawing Sheets

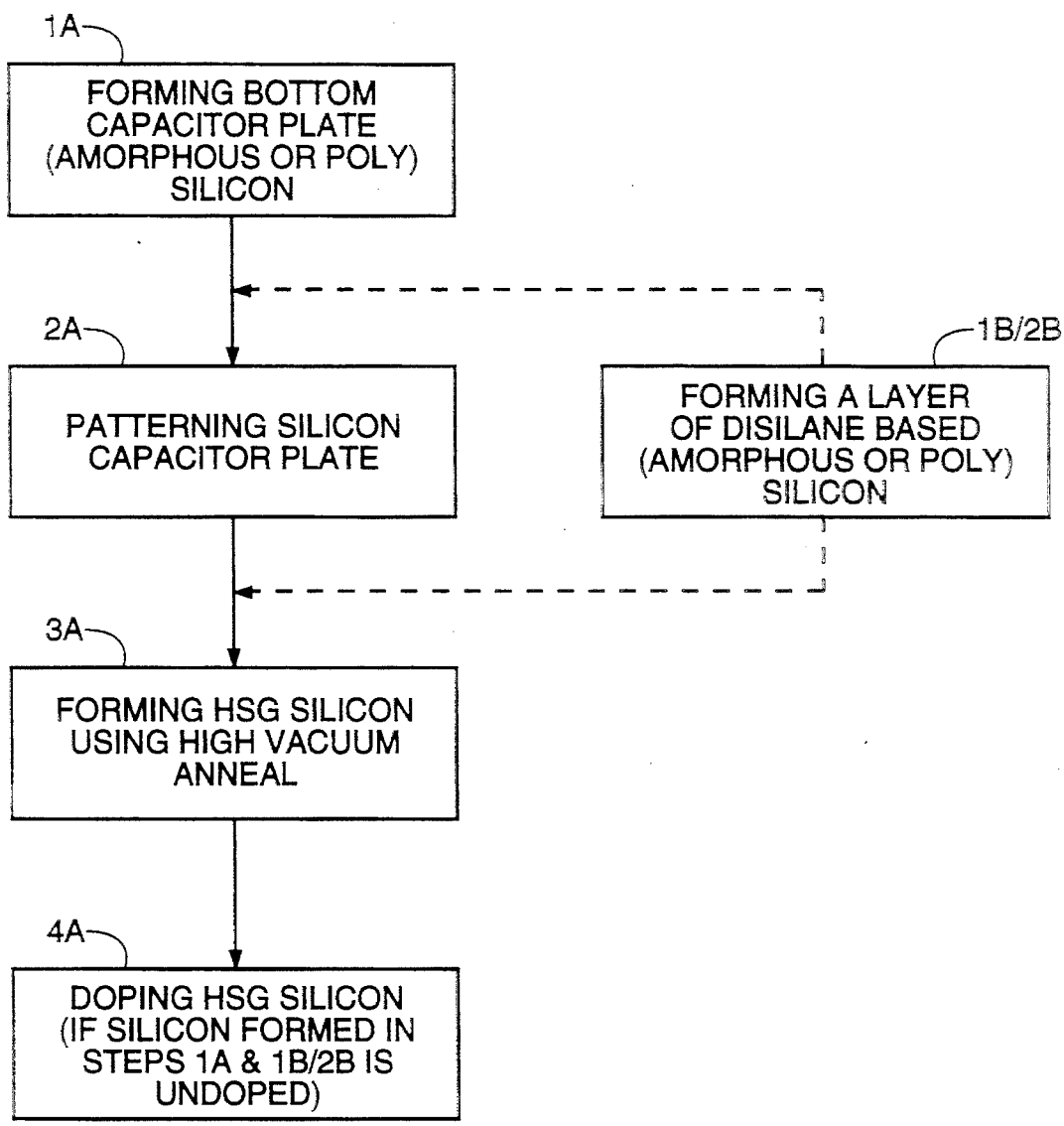
FIG. 1.1

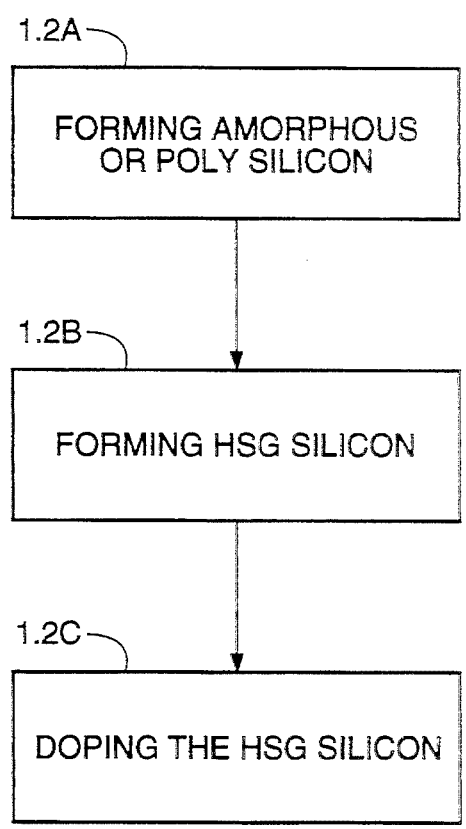
FIG. 1.2

METHOD TO PREPARE HEMI-SPHERICAL GRAIN (HSG) SILICON USING A FLUORINE BASED GAS MIXTURE AND HIGH VACUUM ANNEAL

CROSS REFERENCE TO A RELATED APPLICATION

This application is related to U.S. patent application 08/058,554, filed May 4, 1993, now U.S. Pat. No. 5,278,091 and U.S. patent application 08/106,503, filed Aug. 13, 1993, now U.S. Pat. No. 5,340,765.

1. Field of the Invention

This invention relates to semiconductor fabrication processing and more particularly to a process for forming Hemi-Spherical Grain (HSG) silicon.

2. Background of the Invention

The continuing trend of scaling down integrated circuits has forced the semiconductor industry to consider new techniques for fabricating precise components at submicron levels. Along with the need for smaller components, there has been a growing demand for devices requiring less power consumption. In the manufacture of transistors, these trends have led the industry to refine approaches to achieve thinner cell dielectric and gate oxide layers.

In dynamic semiconductor memory storage devices it is essential that storage node capacitor cell plates be large enough to retain an adequate charge (or capacitance) in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer.

Though stacked (capacitor) storage cells are promising candidates to achieve sufficient storage capacitance in a limited area, as the DRAM cell size shrinks, scaling of the stacked capacitor structures is becoming more difficult.

Conventionally, it is known that the storage capacitance can be enhanced by using Hemi-Spherical Grain (HSG) silicon to form the storage node electrode without increasing the area required for the cell or the storage electrode height. The available methods include use of Low Pressure Chemical Vapor Deposition (LPCVD), engraving storage electrodes using poly film followed by P-diffusion utilizing POCl3 source gas, a mixture of spin-on-glass (SOG), coating the polysilicon with resist, and HSG formation by sequent high vacuum annealing. These methods however, are plagued due to formation of HSG silicon only on the inside of the storage node structure and thinning of the electrode itself.

SUMMARY OF THE INVENTION

The present invention develops a process for forming a hemi-spherical grained silicon by the steps of:
 forming a silicon layer; and
 exposing the patterned silicon layer to a fluorine based gas mixture during an annealing period, thereby transforming the silicon layer into said hemi-spherical grained silicon.

BRIEF DESCRIPTION OF THE DRAWINGS

FIG. 1.2 is a process flow diagram of a second embodiment of the present invention;

FIG. 1.1 is a process flow diagram of the formation of a DRAM capacitor cell plate using the method of the present invention;

DETAILED DESCRIPTION OF THE PRESENT INVENTION

Figure 1:
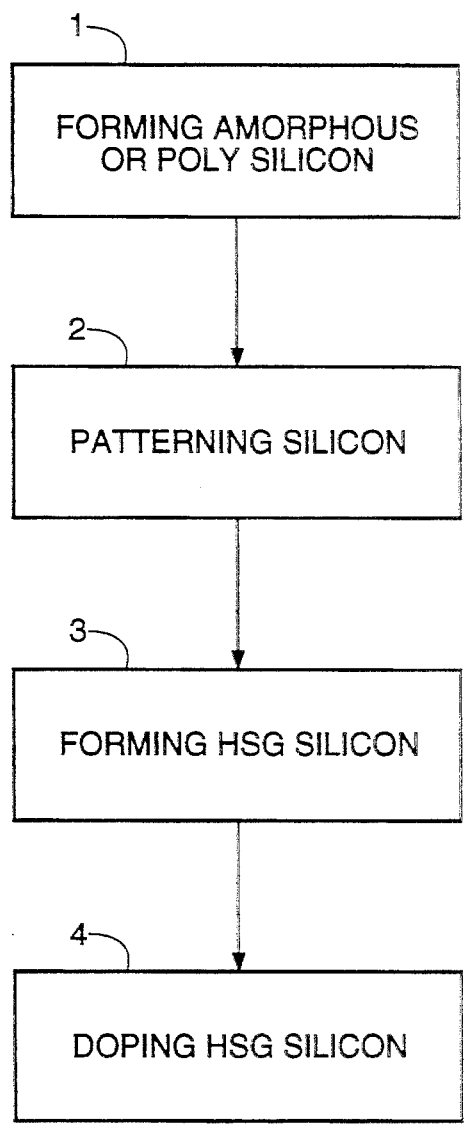
FIG. 1 is a process flow diagram of an embodiment of the present invention.

The present invention is directed to a process for forming hemispherical grain silicon (HSG) as depicted in the process steps of FIG. 1.

Referring now to FIG. 1, in step 1, silicon is formed over a starting substrate in a reaction chamber. The silicon may be either polycrystalline (poly) silicon or amorphous silicon. In step 2, the formed silicon is typically patterned (although it doesn't need to be patterned) into a desired shape by methods know in the art, or methods yet to be discovered. In step 3, the silicon is then transformed into Hemi-Spherical Grain (HSG) silicon by a unique method. During this step, the silicon is subjected to an anneal at a temperature range of at least 450° C. and at a pressure of $1 \times 10^{-3}$ Torr to $1 \times 10^{-10}$ Torr. A diluted fluorine based gas mixture, such as $NF_3$, $CF_4$, $C_2F_6Cl_2$ gas (diluted with an inert gas, such as Ar or nitrogen) is bled into the reaction chamber. The result is the transformation of a basically smooth silicon surface into HSG silicon.

FIG. 1.2 demonstrates the basic concept depicted in FIG. 1 except that the formed silicon need not be patterned prior to forming HSG.

The temperature anneals can be implemented in at least two ways. A first way entails fixing the temperature at a constant temperature, say 600° C., for the duration of the anneal. The second way entails slowly ramping up the temperature from room temperature to say 650° C. (560°-620° C. is preferred). It is preferred that the pressure be in the range of $1 \times 10^{-3}$ Torr to $1 \times 10^{-10}$ Torr as the ambient during the anneal is the key to transforming the silicon into HSG silicon.

As an example, one of the many uses of the present invention is depicted in the construction of a DRAM container storage cell developed in FIGS. 1.1 and 2-4.

Referring now to FIG. 1.1, in step 1a, a bottom silicon capacitor plate is formed over a starting substrate in a reaction chamber. The silicon plate may be either polycrystalline (poly) silicon or amorphous silicon. In step 2a, the formed silicon plate is patterned into a desired shape by methods know in the art, or methods yet to be discovered. An optional step 1b/2b may be performed before or after step 2a which entails the steps of forming a layer of disilane based silicon (again, either polycrystalline (poly) silicon or amorphous silicon). In step 3a, the silicon is then transformed into Hemi-Spherical Grain (HSG) silicon by subjecting the forming silicon an anneal at a temperature range of at least 450° C. and at a pressure of $1 \times 10^{-3}$ Torr to $1 \times 10^{-10}$ Torr. A diluted fluorine based gas mixture, such as $NF_3$, $CF_4$, $C_2F_6Cl_2$ gas (diluted with an inert gas, such as Ar or nitrogen) is bled into the reaction chamber. During this time, nucleation begins at the silicon surface as the gas is bled in and the silicon is exposed to heat and vacuum anneal and the native oxide is replaced by the nucleation of the silicon particles. The result is the transformation of a basically smooth silicon surface into HSG silicon. The HSG silicon can be further enhanced by performing an optional etch step that will cause the rugged surface to become more pronounced. In step 4a, the HSG silicon is then conductively doped if it hadn't been previously doped during steps 1a and 1b/2b, to form the bottom plate of a DRAM capacitor cell. The methods depicted in FIGS. 1, 1.1 and 1.2 can be used in such processes as rapid thermal processing chemical vapor deposition, molecular beam epitaxy or conventional low pressure chemical deposition systems.

Figure 2:
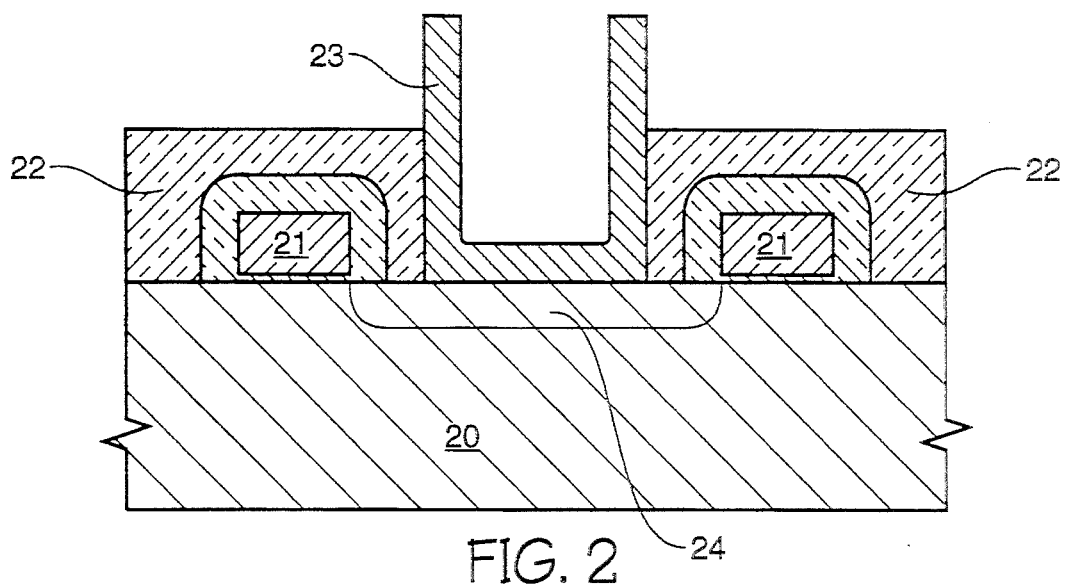
FIG. 2 is a composite cross-sectional view of an in-process wafer portion depicting the beginning stages of forming a DRAM container storage cell.

Referring now to FIG. 2, a starting substrate 20 is processed with diffusion region 24 formed therein, which is formed between word lines 21. A planarized insulating layer 22 (typically borophosphosilicate glass (BPSG)) is formed over substrate 20, word lines 21 and diffusion region 24. An opening in layer 22 is formed to provide access to diffusion region 24. A container structure 23, formed from either amorphous silicon or polysilicon, makes contact to diffusion region 24 and extends above layer 22.

Figure 3:
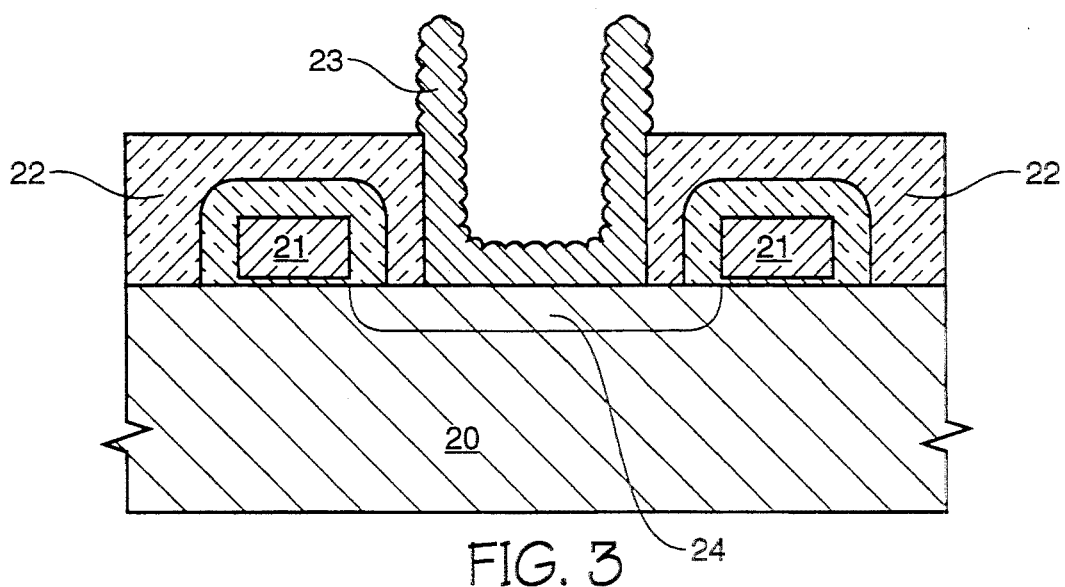
FIG. 3 is a cross-sectional view of the in-process wafer portion of FIG. 2 after subjecting the container structure to fluorine based gas mixture during a high vacuum anneal.

Referring now to FIG. 3, silicon structure 23 is subjected to a high vacuum anneal at a temperature of at least 450° C. and at a pressure of $1 \times 10^{-3}$ Torr to $1 \times 10^{-10}$ Torr or less. During the anneal, a $NF_3$ gas (diluted to approximately 50% with Ar or nitrogen) is bled into the reaction chamber. The result is the transformation of the basically smooth silicon surface of structure 23 (in FIG. 2) into HSG silicon (the rugged structure 23 in FIG. 3). Rugged structure 23 is then conductively doped to serve as a storage node cell plate of an DRAM storage cell. It is preferred to conductively dope structure 23 prior to the anneal step so that problems of doping after HSG formation are avoided. However, if so desired the structure could be conductively doped prior to anneal.

Figure 4:
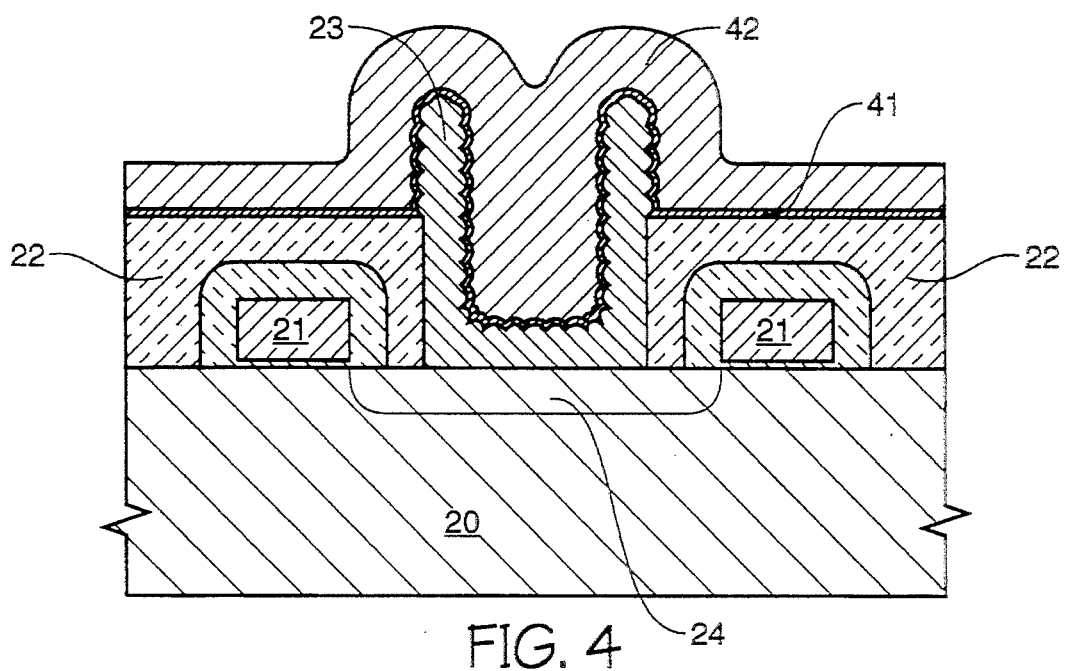
FIGS. 4 is a cross-sectional view of the in-process wafer portion of FIG. 3, depicting a completed DRAM container storage cell.

Referring now to FIG. 4, the DRAM storage cell is completed by forming cell dielectric layer 41 over structure 23, followed by the formation of a second cell plate 42 (typically a conductively doped polysilicon or metal based layer). From this point on, the wafer is completed using conventional fabrication process steps.

It is to be understood that although the present invention has been described with reference to a preferred embodiment, various modifications, known to those skilled in the art, may be made to the structures and process steps presented herein without departing from the invention as recited in the several claims appended hereto.

I claim:

1. A process for forming hemi-spherical grained silicon comprising the steps of:
   forming a silicon layer; and
   exposing said silicon layer to a fluorine based gas mixture during an annealing period, thereby transforming said silicon layer into said hemi-spherical grained silicon, said fluorine based gas mixture is a gas selected from the group comprising $NF_3$, $CF_4$, and $C_2F_6Cl_2$.

2. The process as recited in claim 1 further comprising the step of conductively doping said hemi-spherical grained silicon.

3. The process as recited in claim 1, wherein said silicon comprises amorphous silicon.

4. The process as recited in claim 1, wherein said silicon comprises polycrystalline silicon.

5. The process as recited in claim 1, wherein said process comprises rapid thermal processing chemical vapor deposition.

6. The process as recited in claim 1, wherein said fluorine based gas mixture is diluted with an inert gas.

7. The process as recited in claim 6, wherein said inert gas is a gas selected from the group comprising Ar and $N_2$.

8. The process as recited in claim 1, wherein said annealing period is performed at a temperature of at least 450° C. and at a pressure of $1 \times 10^{-3}$ Torr and less.

9. The process as recited in claim 1, wherein said temperature is held at a constant temperature of approximately 600° C. during the entire said annealing period.

10. The process as recited in claim 1, wherein said temperature is ramped up to at least 450° C. during the annealing period.

11. The process as recited in claim 1, wherein said temperature is ramped up from approximately 560° C. to approximately 620° C. during the annealing period.

12. The process as recited in claim 1, wherein said process comprises low pressure chemical vapor deposition.

13. The process as recited in claim 1 further comprising the additional step of patterning said silicon layer after the step of forming said silicon layer.

14. A process for forming hemi-spherical grained silicon capacitor plates, said process comprising the steps of:
   forming a silicon layer over a pair of neighboring parallel conductive lines, said silicon layer making contact to an underlying conductive region;
   patterning said silicon layer to form individual silicon capacitor plates; and
   exposing said silicon capacitor plates to a fluorine based gas mixture during an annealing period, thereby transforming said silicon capacitor plates into said hemi-spherical grained silicon capacitor plates, said fluorine based gas mixture is a gas mixture selected from the group comprising $NF_3$, $CF_4$, and $C_2F_6Cl_2$.

15. The process as recited in claim 14 further comprising the step of conductively doping said hemi-spherical grained silicon capacitor plates.

16. The process as recited in claim 14, wherein said silicon comprises amorphous silicon.

17. The process as recited in claim 14, wherein said silicon comprises polycrystalline silicon.

18. The process as recited in claim 14, wherein said silicon comprises deposited hemi-spherical grain silicon which is further etched thereby increasing the capacitor plate area.

19. The process as recited in claim 18, wherein said etching is performed separately using an etch chemical selected from the group comprising hydrofluoric acid (HF), hydrobromic (HBr) and the like.

20. The process as recited in claim 1, wherein said process comprises molecular beam epitaxy.

21. The process as recited in claim 14, wherein said fluorine based gas mixture is diluted with an inert gas.

22. The process as recited in claim 21, wherein said inert gas is a gas selected from the group comprising Ar and $N_2$.

23. The process as recited in claim 14, wherein said annealing period is performed at a temperature of at least 450° C. and at a pressure of $1 \times 10^{-3}$ Torr to $1 \times 10^{-10}$ Torr.

24. The process as recited in claim 14, wherein said temperature is held at a constant temperature of approximately 450° C. during the entire said annealing period.

25. The process as recited in claim 14, wherein said temperature is ramped up to approximately 450° C. during the annealing period.

26. The process as recited in claim 14, wherein said temperature is ramped up from approximately 560° C. to approximately 620° C. during the annealing period.

27. The process as recited in claim 14, wherein said process comprises rapid thermal processing chemical vapor deposition.

28. A process for forming hemi-spherical grained silicon storage capacitor plates, said process comprising the steps of:
   forming a silicon layer over a pair of neighboring parallel conductive lines, said silicon layer making contact to an underlying conductive region;
   patterning said silicon layer to form individual silicon capacitor plates;
   exposing said silicon capacitor plates to a fluorine based gas mixture during an high vacuum annealing period, thereby transforming said silicon capacitor plates into said hemispherical grained silicon capacitor plates, said fluorine based gas mixture is a gas mixture selected from the group comprising $NF_3$, $CF_4$, and $C_2F_6Cl_2$;
   conductively doping said hemi-spherical grained silicon capacitor plates;
   forming a capacitor dielectric layer adjacent and coextensive said hemi-spherical grained silicon capacitor plates; and
   forming a second conductive silicon layer superjacent and coextensive said capacitor dielectric layer.

29. The process as recited in claim 28, wherein said silicon comprises amorphous silicon.

30. The process as recited in claim 28, wherein said silicon comprises polycrystalline silicon.

31. The process as recited in claim 14, wherein said process comprises low pressure chemical vapor deposition.

32. The process as recited in claim 28, wherein said fluorine based gas mixture is diluted with an inert gas.

33. The process as recited in claim 32, wherein said inert gas is a gas selected from the group comprising Ar and $N_2$.

34. The process as recited in claim 28, wherein said annealing period is performed at a temperature of at least 450° C. and at a pressure of $1 \times 10^{-3}$ Torr to $1 \times 10^{-10}$ Torr.

35. The process as recited in claim 28, wherein said temperature is held at a constant temperature of approximately 450° C. during the entire said annealing period.

36. The process as recited in claim 28, wherein said temperature is ramped up to approximately 450° C. during the annealing period.

37. The process as recited in claim 28, wherein said temperature is ramped up from approximately 560° C. to approximately 620° C. during the annealing period.

38. The process as recited in claim 14, wherein said process comprises molecular beam epitaxy.

39. A process as recited in claim 28, wherein said second conductive layer comprises conductively doped silicon.

40. The process as recited in claim 28, wherein said process comprises rapid thermal processing chemical vapor deposition.

41. The process as recited in claim 28, wherein said process comprises low pressure chemical vapor deposition.

42. The process as recited in claim 28, wherein said process comprises molecular beam epitaxy.

* * * * *